United States Patent [19]

Yukawa

[11] Patent Number: 4,764,753
[45] Date of Patent: Aug. 16, 1988

[54] ANALOG TO DIGITAL CONVERTER

[75] Inventor: Akira Yukawa, Tokyo, Japan

[73] Assignee: NEC Corporation, Tokyo, Japan

[21] Appl. No.: 757,989

[22] Filed: Jul. 23, 1985

[30] Foreign Application Priority Data

Jul. 23, 1984 [JP] Japan ................... 59-152269
Dec. 28, 1984 [JP] Japan ................... 59-277482

[51] Int. Cl.[4] .............................. H03M 1/46
[52] U.S. Cl. .................. 340/347 AD; 340/347 M; 340/347 DA; 340/347 NT; 332/11 D; 375/30
[58] Field of Search .... 340/347 AD, 347 C, 347 DA, 340/347 NT; 332/11 D; 375/30; 324/99 D

[56] References Cited

U.S. PATENT DOCUMENTS 3,587,087  6/1971  King ....................... 340/347 DD
4,195,282  3/1980  Cameron ................. 340/347 AD
4,384,276  5/1983  Kelley et al. ............ 340/347 DA
4,384,278  5/1983  Benjamin ................ 340/347 AD Primary Examiner—T. J. Sloyan
Attorney, Agent, or Firm—Sughrue, Mion, Zinn, Macpeak & Seas

[57] ABSTRACT

An improved analog to digital converter suitable for fabrication on an integrated circuit and operable at high speed is disclosed.

The converter is of the type when a voltage generated by a built-in D/A converter is successively subtracted from an input analog signal and the digital code of the built-in D/A converter is derived as the digital output when the coincidence between the voltage generated by the D/A converter and the input analog signal is detected by a comparator. The output of the comparator is fed back and superposed on the subtracted result as well as being used to control the D/A converter.

6 Claims, 3 Drawing Sheets

4,764,753

ANALOG TO DIGITAL CONVERTER

BACKGROUND OF THE INVENTION

The present invention relates to an analog to digital (A/D) converter for converting an analog signal to a digital signal.

A typical example of an A/D converter with high operation speed is the so-called successive approximation A/D converter which has been advantageously utilized in the form of a semiconductor integrated circuit. The A/D converter of this type operates as follows. First, an analog signal to be converted into a digital signal is sampled by a sampling signal and held. Then, the sampled analog signal is compared with an internal analog signal generated by a built-in digital to analog (D/A) converter. If the result of the comparison does not indicate the coincidence of the sampled analog signal and the internal analog signal, the value of the internal analog signal is changed so as to reduce the difference between the sampled analog signal and the internal analog signal until the internal analog signal becomes co-incident with the sampled analog signal. The digital value of the built-in D/A converter at the time when coincidence is detected is derived as the digital output corresponding to the sampled analog signal.

The successive approximation A/D converter is utilized especially in the field of audio signal processing.

The A/D conversion of an audio signal has been performed using a sampling signal at a frequency two or more times the frequency of input analog signal to be converted. Since noise of a frequency higher than that of the analog signal is generated through the sampling operation, an analog filter is provided to eliminate the noise prior to A/D conversion. However, it has been difficult to produce the analog filter in an integrated circuit device with high precision and with high reproducibility. In order to avoid the use of the analog filter, it is necessary to obtain a high-speed, simple-construction A/D converter as an integrated circuit, in which the analog signal together with noise is converted into a digital signal which is then applied to a digital filter, to discriminate the signal from the noise.

SUMMARY OF THE INVENTION

It is one object of the present invention to provide an A/D converter which can operate at a high speed.

It is another object of the present invention to provide an A/D converter which can be fabricated with a reduced number of circuit elements.

The analog to digital converter according to the present invention is of the type in which an internal voltage generated by a built-in D/A converter is subtracted from an input analog signal and a comparator is used to detect whether the internal voltage coincides with the input analog signal, and is characterized in that the output of the comparator is superposed on the internal voltage.

According to the present invention, the output of the comparator is superposed on the internal voltage so as to increase the value of the voltage to be subtracted, and hence a feed back loop including the D/A converter, the comparator and the subtracting circuit can be stabilized.

Moreover, according to the present invention, a CR circuit for stabilizing the feed back loop is no longer necessary and the superposition of the output of the comparator on the internal voltage can be performed by a simple circuit without a resistor. Therefore, the A/D converter of the invention can be produced in integrated circuit form with ease.

DETAILED DESCRIPTION OF THE INVENTION

Figure 1:
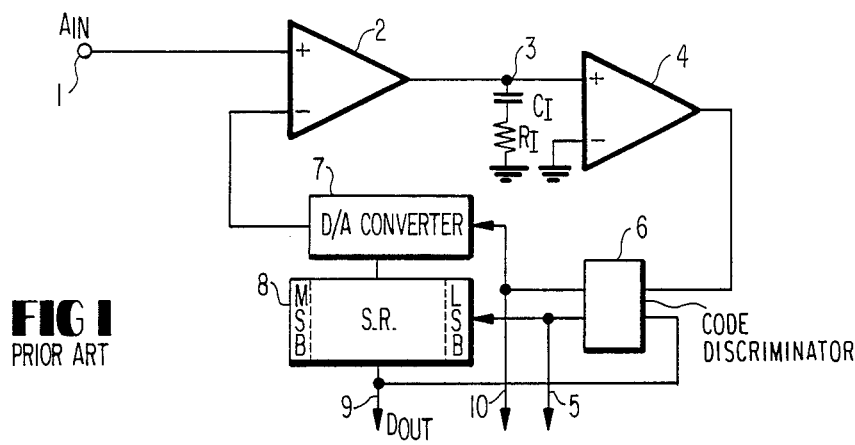
FIG. 1 is a schematic diagram of the prior art A/D converter.

Referring to FIG. 1, a prior art A/D converter is explained.

The difference between an input analog signal Ain applied to an input terminal 1 and an output voltage of a D/A converter 7 is obtained by a differential amplifier 2 at its output node 3 and is integrated by a capacitor CI connected to the node 3. Here, a resistor $R_I$ is connected in series with the capacitor $C_I$ because it is essential in stabilizing the feedback system, and the time constant ($C_I \times R_I$) of this series circuit is selected so as to be about 1.5 times as large as the sampling period. However, the capacitance of the capacitor $C_I$ and the resistance of the resistor $R_I$ have values which are too large to permit integration on a semiconductor chip, and they are usually attached outside of the chip. Moreover, the reproducibility of the time constant ($C_I \times R_I$) is poor if these elements are fabricated on the semiconductor chip. The polarity of the voltage at the node 3 is judged by a voltage comparator 4. In accordance with this judgement result, the output of the converter 7 is increased or decreased in a non-linear manner by means of an R/L shift register 8 for storing the absolute value of a voltage to be D/A converted and a code discriminator 6 for indicating the shift direction and the polarity of the D/A converter 7. This non-linearity is produced either by incrementing the contents of the register 8, which is implemented by shifting the contents of the R/L shift register 8 leftward by 1 bit, and writing "1" to the least significant bit LSB to double the content of the shift register, or by shifting the same rightward by 1 bit to write "0" to the most significant bit MSB, to halve the content of the shift register. When the whole content of the shift register becomes zero, the polarity of the code discriminator 6 is reversed.

In this system, feedback is so conducted that the output voltage of the capacitor $C_I$ approaches zero. As a result, the shift register 8 takes either one of two kinds of data $v_1$ and $v_2$, both taking the value "1" at the right ends and being closest to an input voltage $v_i$ applied from the outside, and the possibility of taking the data $v_2$ and the data $v_2$ is $(v_2-v_i):(v_i-v_1)$, where $v_1$ is assumed to be less than $v_2$. According to this system, when the signal frequency band is sufficiently higher than the Nyquist frequency, it is possible to handle a signal of wider dynamic range which is broader that that intrinsic to the D/A converter and that determined by the ratio of the signal band and the Nyquist frequency. In a D/A converter of 10 bits, for example, the voltage value output from the D/A converter, consists however, of only roughly pitched voltages such as 0000000001, 0000000011 or 0000000111. Thus, a rise in the signal voltage will increase the errors in the voltage to be stored in the capacitor $C_I$. As compared with the case in which conversion is conducted by means of the usual A/D converter, therefore, there arises a defect in that the signal-to-noise ratio is reduced.

As has been described hereinbefore, moreover, the resistor $R_I$ is difficult to fabricate precisely in an integrated circuit and would occupy a considerable area.

Figure 2:
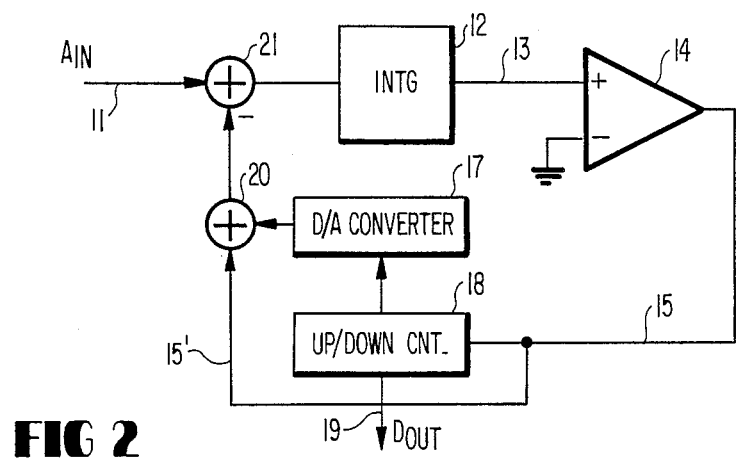
FIG. 2 is a schematic diagram showing the basic structure of the A/D converter of the present invention.

Referring to FIG. 2, the basic structure of the present invention is described.

As shown in FIG. 2, an output of a comparator 14 is applied to an up/down counter 18 via a path 15 and to an analog summing circuit 20 with a path 15'. The parallel bit outputs of the counter 18 are fed to a D/A converter 17 as digital data. The analog output of the D/A converter 17 is applied to the analog summing circuit 20 and the sum of the analog signal from the D/A converter and the output of the comparator 14 is applied to the analog summing circuit 21 to which an unknown input analog signal $A_{in}$ to be converted is applied. The analog summing circuit 21 subtracts the summed signal produced by the analog summing circuit 20 for the input analog signal $A_{in}$. The resultant output of the circuit 21 is applied to an integrator 12 whose output is supplied to the comparator 14. In this arrangement, the signal path 15' from the comparator 14 to the circuit 20 has a significant role in stabilizing the converting operation, which has been performed by a feedback loop stabilization circuit using a series circuit of a resistor and a capacitor according to the prior art.

The parallel bit outputs 19 of the D/A converter 17 are output as the resultant digital output corresponding to the input analog signal $A_{in}$ when the output of the integrator 12 becomes zero.

In each comparison cycle, when the output of the comparator 14 is positive, the content of the counter 18 is incremented, and the increased value of the summed signal from the circuit 20 is subtracted from the signal $A_{in}$. This renewed resultant value from the circuit 21 is added to the value integrated by the integrator 12 and the renewed integrated value is applied to the comparator 14 for a subsequent comparison operation.

If the analog-adding and analog-subtracting operations are performed by capacitor circuits, operational amplifiers have been indispensable in the prior art supply the outputs of the respective capacitor circuits to subsequent circuits. But, in the present invention, since the analog summing operation is conducted in one place, it is expected that only a single operational amplifier would be needed, as compared with the plurality of operational amplifiers used in the prior art.

Since an feedback loop has the integrator 12 in the signal transmission path from the signal input terminal 11 to the voltage comparator 14, the data outputted at the output terminal 19 from the counter 18 via the feedback loop has a time correlation, and its noise power spectrum $H(\omega)$ for an angular frequency $\omega$ is characterized by the following distribution:

$$|H(\omega)|^2 = \Delta^2/3 \times 2(1-\cos\omega T),$$

wherein $\Delta$ designates the minimum resolution of the D/A converter and T designates the sampling period, The noise power spectrum $H(\omega)$ takes a very small value for a low frequency and a high value for a high frequency. By adding the digital filter to the output data train obtained from a terminal 19, therefore, it is possible to achieve a far higher S/N ratio than that which is computed from the bit number of the internal D/A converter 17 and the ratio of the signal band to the Nyquist frequency. The percentage improvement in the S/N ratio is substantially proportional to $M^2$, where the ratio of the signal band to the Nyquist frequency is represented by 1/M. The output voltage range of he D/A converter 17 used in the present circuit is required to be equal to or slightly larger than the voltage range between the upper and lower limits of the input signal voltage. The minimum resolution voltage $\Delta$ is optimum if it is set as follows:

$$\Delta \approx 2 f_s A/f_c,$$

wherein $f_s$ designates the frequency of the input signal; 2A designates the maximum amplitude (i.e., the peak to peak value) of the input signal voltage; and $f_c$ designates the sampling frequency. Therefore, the bit number of the D/A converter is desired to be the integer value closest to $\log(2A/\Delta)/\log_2$. According to the present system, A/D conversion with a signal band width of 4 KHz and 13-bit precision, for example, can be realized with sufficient allowance using a 6-bit D/A converter and a sampling frequency of 1 MHz. Moreover, the digital signal obtained can achieve an S/N ratio of 80 dB or higher at maximum, whereas the maximum S/N ratio was 40 to 50 dB in the circuit of the prior art. Since the circuit of the present invention requires no resistor in series with the integrating capacitor, which has been indispensable in the circuit of the prior art, still moreover, it can be realized with ease in integrated circuit form.

In realizing this circuit as an integrated circuit, more desirable characteristics can be obtained when the voltage amplitudes to be handled by the analog portion inside the circuit are smaller.

Figure 3:
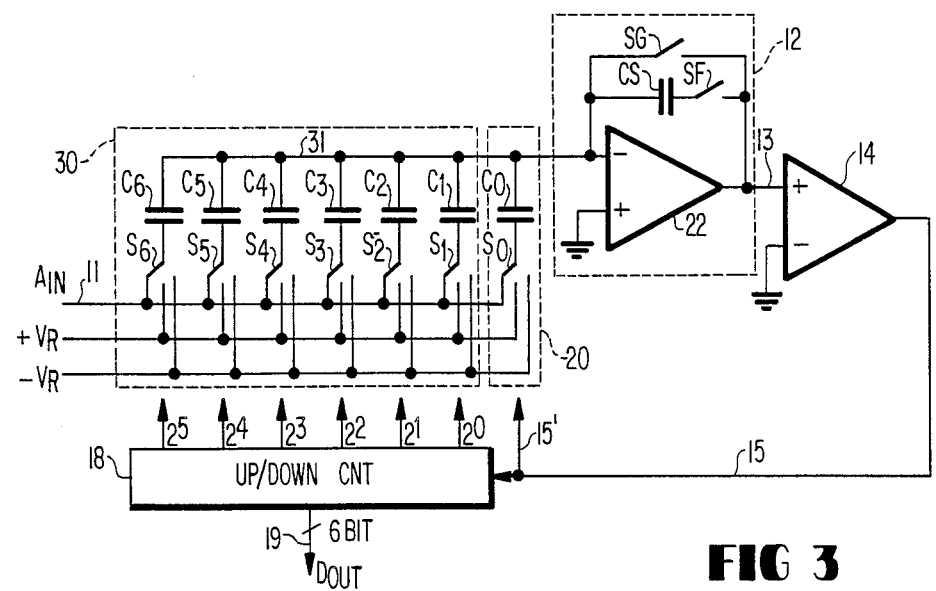
FIG. 3 is a schematic diagram of a first embodiment of the present invention.

With reference to FIG. 3, a detailed embodiment of the present invention is described.

In FIG. 3, the elements or blocks corresponding to those in FIG. 2 are designated by similar references except for the analog-summing circuit 21 and the D/A converter 17 in FIG. 2. Namely, in FIG. 3, array circuit 30 corresponds to both the circuit 21 and the D/A converter 17. The array circuit 30 includes capacitors $C_1$ to $C_6$ whose capacitances are sequentially weighted by a factor of 2. Namely, the ratio of the capacitances of the capacitors $C_1$ to $C_6$ are expressed as $C_1:C_2:C_3:C_4:C_5:C_6 = 1:2:4:8:16:32$. First ends of those capacitors $C_1$ to $C_6$ are coupled in common to an inverting input of an operational amplifier 22, which forms the integrator 12 along with a capacitor CS and switches SF and SG, through a line 31. The other ends of the capacitors $C_1$ to $C_6$ are connected to common electrodes of switches $S_1$ to $S_6$ which take three states: connection between the common electrode and an input line 11 for receiving an input signal $A_{in}$; connection between the common electrode and a line of a positive reference voltage $+V_R$; and connection between the common electrode and a line of a negative reference voltage $-V_R$. The up/down counter 18 has 6-bit outputs $2^0$ to $2^5$. The outputs $2^0$ to $2^5$ are used to control the switches $S_1$ to $S_6$, respectively. The analog summing circuit 20 is composed of a capacitor C0 having one end connected to the line 31 and a switch S0 having a common electrode connected to the other end of the capacitor C0 and three electrodes connected to the line 11, $+V_R$ and $-V_R$, respectively. The switch S0 is controlled in the same manner as the switches $S_1$ to $S_6$ with respect to the output of the comparator 14 applied via the path 15'. Namely, during a sampling period of the switch S0 connects the capacitor to the input terminal 11 and the switches $S_1$ to $S_6$ connect the capacitors $C_1$ to $C_6$ to the terminal 11. The comparator 14 produces a positive output value when the potential at the node 13 is positive while it produces a negative value when the potential at the node is negative. When the output of the comparator 14 is positive, the switch S0 connects capacitor C0 to the $+V_R$. when the output of comparator is negative, the switch S0 connects the capacitor to $-V_R$.

Now, it is assumed that an absolute value of the voltage applied to the input (−) of the amplifier 22 via the capacitor C0 is approximately equal to the voltage corresponding to the minimum resolution. The above voltage becomes about 78 mV for a full-scale voltage of 5 V (78 mV=5 V/$2^6$) and the capacitance of the capacitor C0 is set to have the same capacitance as the capacitor C1. When the absolute value controlled by the output of the comparator 14 is half of the voltage corresponding to the minimum resolution, the capacitance of the capacitor C0 is set to half of that of the capacitor C1 (C0=½ C1). While, if the output voltage of the comparator 14 is twice the voltage corresponding to the minimum voltage, then the relation C0=2C1 is introduced. The capacitance of the capacitor CS is set at value from thirty two to sixty-four times that of the capacitor C1 in the case of six-bit D/A conversion.

The operation of the present circuit will now be described. In the signal input cycle, first of all, the swiches $S_0$ to $S_6$ are connected to the input line 11, and the switch SF is opened (OFF) whereas the switch SG is closed (ON). In this state, the capacitors $C_0$ to $C_6$ store the voltage which is obtained by subtracting the offset voltage of the operational amplifier 12 from the input analog signal Ain.

Next, the switch SG is opened whereas the switch SF is closed. Also, among the switches $S_0$ to $S_6$, the switch or switches controlled by the stage or stages of the 6-bit up/down counter 18 which store logical values of "1" are connected with the $+V_R$ terminal whereas the switches controlled by the stages of the counter storing logical values of "0" are connected with the $-V_R$ terminal. By this operation, the output $V_{on}$ of the operational amplifier is expressed by the following equation:

$$V_{on}=V_{on-1}+V_i-V_k\pm\Delta,$$

wherein C5=64C1 and C1=C0; $V_{on-1}$ designates the previous output voltage; $V_k$ the voltage which has been D/A converted from the data stored in the up/down counter; and $\Delta(\Delta=V_R/32)$ the minimum resolution of the D/A converter. Here, the last term takes a negative value, when the output of the voltage comparator 14 is at logic 1, and a positive value when the same is at logic zero. At the end of this operation cycle, the polarity of the output of the integrator 12 is judged by the voltage comparator 14. The value 1 is added to the up/down counter 18, if the judgement result is logic 1, and is subtracted from the same if the same result is logic zero, and the subsequent signal input cycle is entered. Since the content of the up/down counter 18 is increased or decreased to minimize the accumulated value of the differences between the input signal and the D/A converter outputs, the output voltage of the integrator, which is the accumulated value of the errors, does not exceed twice the minimum resolution of the D/A converter with respect to ground potential. As a result, the output range of the operational amplifier 22 in the integrator 12 can be made very narrow so that it can be advantageously operated by a low power supply voltage and can find very suitable applications to VLSI circuits which cannot or do not have a high power supply voltage. The small deflection of the output voltage of the integrator 12 raises another advantage in that the so-called "settling time" required for equalizing the input and output voltages of the operational amplifier 22 by turning on the switch SG for offset cancellation is shortened to a small value thereby to facilitate high speed integrator operation.

Figure 4:
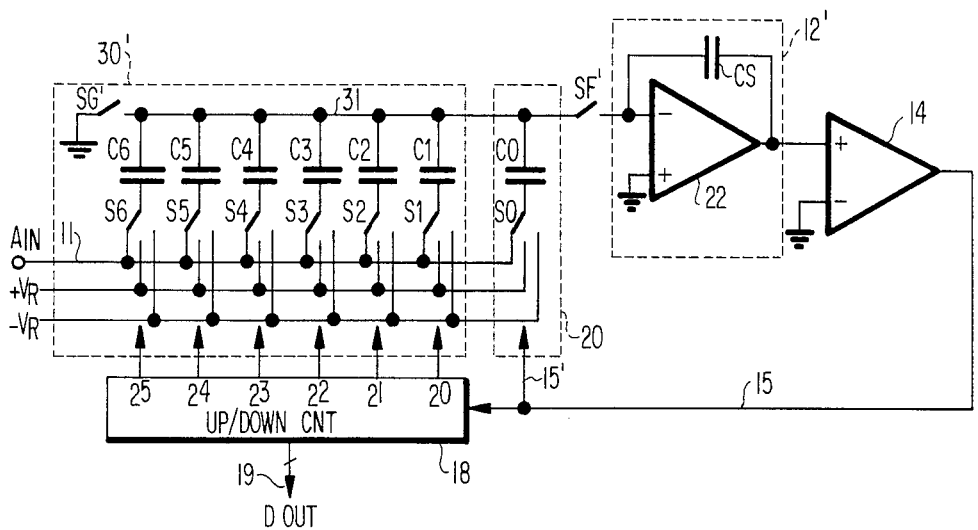
FIG. 4 is a schematic diagram of a second embodiment of the present invention.

FIG. 4 shows another embodiment of the present invention.

The embodiment shown in FIG. 3 is directed to structure for eliminating the offset voltage of the operational amplifier 22. In the case where it is not necessary to eliminate the offset voltage of the operational amplifier the, d.c. component of the offset voltage is superposed on the output 19 in the circuit of FIG. 3.

The embodiment of FIG. 4 is directed to the case where the offset voltage of the operational amplifier is negligible.

The differences of the circuit of FIG. 4 reside in that the common line 31 is connected to the ground potential via a switch SG' and to the inverting input of the operational amplifier 22 via a switch SF' in and that the capacitor CS is directly coupled between the output and the inverting input of the operational amplifier 22.

Operations of the switches SG' and SF' are the same as those of the switches SG and SF in FIG. 3, respectively. Namely, the switch SG' is closed whereas the switch SF' is opened during the sampling period. During the subsequent comparison period the switch SG' is opened whereas the switch SF is closed. According to this structure, the time period required for the signal input can be shortened more than the case of FIG. 3.

Figure 5:
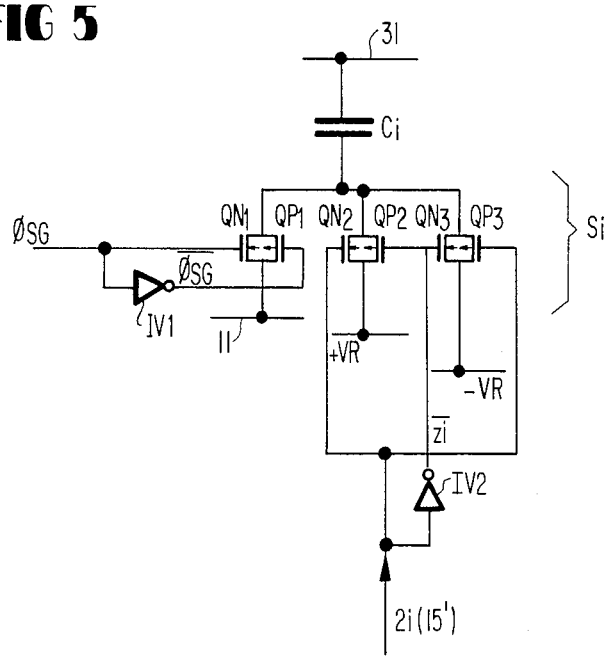
FIG. 5 is a circuit diagram showing one example of the switches employed in the embodiments.

One example of the switch Si (i=0 to 6) employed in the circuits of FIGS. 3 and 4 is shown in FIG. 5.

In FIG. 5, MOS transistors $QN_1$ to $QN_3$ are of the N-channel type while MOS transistors $QP_1$ to $QP_3$ are of the P-channel type. The transistors $QN_1$ and $QP_1$ are connected between the capacitor $C_i$ and the input line 11 in parallel. The transistor $QN_1$ is controlled by a signal $\phi SG$ which is also used to control the switch SG, SG' and the transistor $QP_1$ is controlled by the inverted signal $\phi SG$ from an inverter $IV_1$. The transistors $QN_2$ and $QP_2$ are connected in parallel between the capacitor Ci and the $-V_R$ line while the transistors $QN_3$ and $QP_3$ are connected in parallel between the capacitor Ci and the $-V_R$ line. The transistors $QN_2$ and $QP_3$ are controlled by a true output 2i of the corresponding counter stage and the transistors $QP_2$ are controlled by a complementary output $\overline{2i}$ from an inverter $IV_2$.

Figure 6:
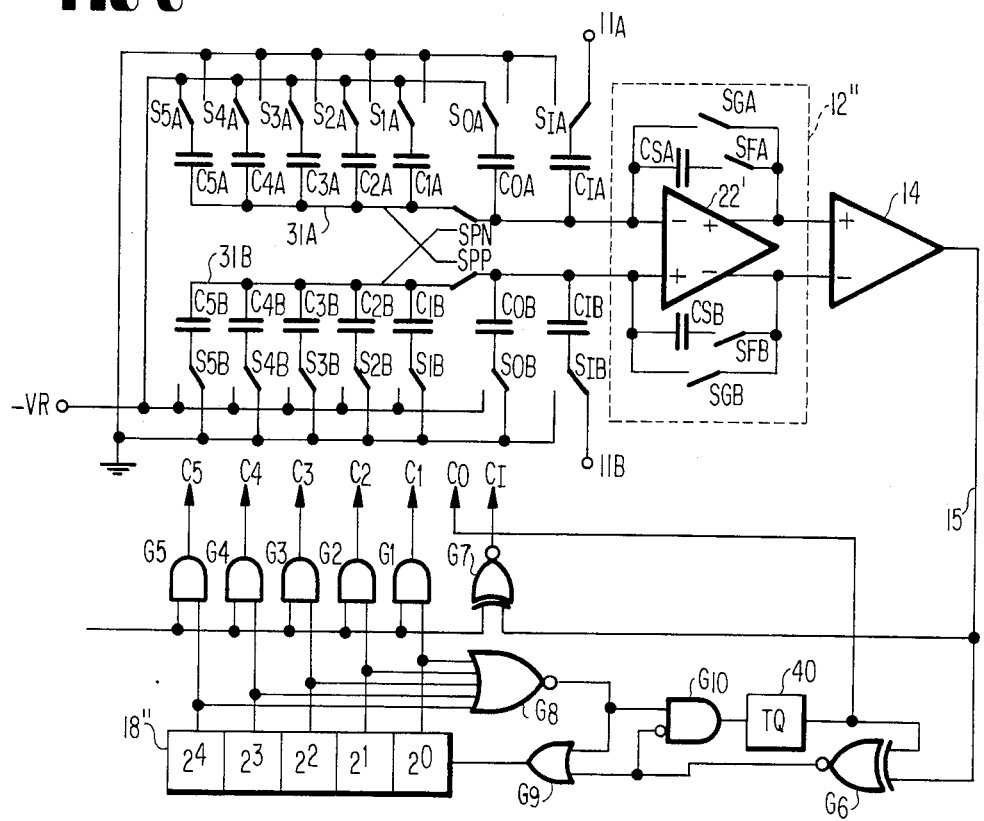
FIG. 6 is a block diagram showing a third embodiment of the invention.

Referring to FIG. 6, a third embodiment of the present invention is described.

This embodiment employs two sets of capacitors and a two-input two-output type operational amplifier 22'. Capacitors C1A to C5A form a first capacitor array and the capacitors C1B to C5B form a second capacitor array.

The capacitance ratios among these capacitors are defined as C1A(C1B):C2A(C2B):C3A(C3B):C4A(C4B):C5A(C5B)=1:2:4:8:16. Capacitors C0A and C0B used for feedback have the same capacitance as capacitors C1A and C1B. These capacitors C0A and C0B correspond to the capacitor C0 in the circuits of FIGS. 3 and 4 in function. Signal holding capacitors CIA and CIB are connected to analog signal inputs 11A and 11D via switches S1A and S1B, respectively. Integrating capacitors CSA and CSB in the integrator 12' have the same function as the capacitor C5 in the previous embodiments. Assuming that the capacitance of the capacitors C1A and C1B is "C", the capacitors CIA, CIB, CSA and CSB have capacitance of "32C". In this circuit, the counter 18" is a 5-bit counter having stages $2^0$ to $2^4$. In the present circuit, the integrator 12" is a balanced charge type constructed by connecting both a switch SFA and a switch SGA in parallel with one of two sets of input and output terminals of the balanced operational amplifier 20' and by connecting both a switch SFB and a switch SGB in parallel with the other set of terminals. The integrator 12" thus constructed has its outputs connected to a voltage comparator 14. Coincidence logic is taken between the output of the comparator 14 and the output of a toggle flip-flop 40. The output of the up/down counter 18" at the previous cycle before is judged by a NOR circuit G8 to determine whether its count value is zero, and the toggle flip-flop 40 is inverted when the count value is zero and when the aforementioned coincident logic is zero, via an AND gate G10 and an Exclusive-NOR G6, respectively. Simultaneously, the up/down counter 18" is incremented by 1 if its value exactly one cycle before is zero or if the coincidence logic, i.e. the output of G6, is 1. Under other conditions, the up/down counter 18" is decremented by 1. In the capacitor arrays, switches S0B to S5B for switching between over the reference potential, VR and the ground potential to feed a negative charge, are controlled in accordance with the states of the respective bits of the up/down counter 18", and a positive charge is generated by likewise controlling the switches S0A to S5A in accordance with the states of the respective bits of the up/down counter 18". The first and second arrays are connected through switches SPN and SPP, respectively, with the respective inputs of the afore-mentioned charge integrators 12" such that the connections are reversed in accordance with the direction of connection of the switches SPN and SPP. The directions in which the switches S0B and S0A are connected are controlled in accordance with the output (CI) of the afornentioned voltage comparator. The capacitors CIA and CIB connected with the switches S1A and S1B are set here at 32C but are designed to be at $2^N$C when the maximum amplitude of the input voltage is equal to the reference potential and when the counter has N bits. If the ratio of the maximum amplitude of then input voltage to the reference voltage is 1:K, the capacitors CIA, CIB have to be set at a value of $2^N$CK. The capacitors CSA and CSB in the integrator 12" may take an arbitrary value but are desired to take an intermediate value between the aforementioned $2^N$C and $2^N$CK. The capacitors C0A and C0B to be connected with the switches S0A and S0B may take a value ranging from ½C to 2C but is the easiest for production if it is equal to C.

Next, the operation of the present circuit will be described when the input signal applied to the terminals 11A and 11B is of the balanced type. This circuit is operated for three periods: the sampling period during the input signal; the period for which the difference between the charge proportional to the sampled signal and the charge proportional to the content of the up/down counter 18" is accumulated in the integrator 12"; and the period for determining the states of the up/down counter 18" and the toggle flip-flop 40. Now, the reference potential of $-V_R$ is assumed to take a negative value. It is also assumed that the positive input terminal 11A and the negative input terminal 11B are fed, as input voltages, a positive voltage and a voltage having a value equal to the positive voltage and inverted with respect to the ground potential, respectively. During the input sampling operation, the switches SGA and SGB are turned on whereas the switches SFA and SFB are turned off. The switches S1B to S5B are turned to the ground potential whereas the switches S1A to S5A are turned to the reference potential $(-V_R)$. When the toggle flip-flop 40 outputs logic 1 and the voltage comparator 14 has an output at 1, the switch S0B is grounded whereas the switch S0A is connected to the reference potential. The switches SIA and SIB are connected to the input terminals 11A and 11B, respectively. The switches SPP and SPN are connected in the forward direction, as shown. Next, the integrating period is started by opening the switches SGA and SGB, closing the switches SFA and SFB, turning the switches SIA and SIB to the ground potential and causing a clock $\phi CL$ to take the logic 1 value to thereby connect the switches S1B to S5B to the reference potential and the switches S1A to S5A to ground. Now, if the count in the up/down counter 19' is "00101", the switches S1B, S2B and S0B are changed over from ground to the reference potential whereas the switches S1A, S2A and S0A are changed over from the reference potential to ground. If the positive input voltage is assumed to be $V_i$ whereas the negative voltage is assumed to be $-V_i$, the integrator 12" has its non-inverting (+) and inverting (−) inputs fed the charges of "$-32C\ V_i+6C\ V_R$" and "$32C\ V_i-6C\ V_R$", respectively. As a result, for the output voltage of the integrator of one period before, the voltage changes of $V_i-6V_R/32$ and $-V_i+6V_R/32$ are made at the plus and minus output terminals of the charge integrator 12', respectively, to achieve accumulation of the input portion in such a form as is balanced for the analog signal so that the output voltage is changed twice as much as in the unbalanced circuit. The output of the integrator 12' is judged as to its polarity by the voltage comparator 14 and is transferred to the logic circuit portion. At the end of the comparison, the switches STA and STB are opened whereas the switches SGA and SGB are closed and the clock $\phi_{CL}$ is returned to zero. The coincidence logic is taken between the outputs of the voltage comparator 14 and the toggle flip-flop 40 by means of Exclusive NOR circuit G6. The coincidence logic output and the output of up/down counter 18" at the previous cycle, delivered via NOR gate G8, are supplied to AND gate G10. The toggle flip-flop 40 is reversed via the gate G10 if both the counted value and the coincidence logic output are at zero. Simultaneously, the up/down counter 18" is incremented by 1 when the coincidence logic is at 1 or when the counted value at the previous cycle is at zero. When the value at the previous cycle is not at zero whereas the coincidence logic value at G6 is at zero, the count value is decremented by 1. In this example, the counted value is 00101, not zero. The output of the toggle flip-flip 40 is at 1. Now, if the output of the comparator is at 1, this means that the input signal is greater than the sum of the voltages corresponding to the value of the up/down counter 18″ and the voltage stored in the charge integrator in the previous cycle. Since, in this case, the coincidence logic output takes the value 1, the up/down counter 18″ is incremented by 1. Now, if the output of the comparator 14 is at zero, this indicates that the input signal is smaller than the aforementioned sum. In this case, the coincidence logic output takes the value zero. Since the output of the NOR gate G8 connected to the counter is also at zero, moreover, the counter is decremented by 1. Thus, the value of the counter is increased or decreased in accordance with the input signal.

Now, let us assume that the content of the counter 18″ is zero and that the output of the voltage comparator 14 is also zero in the subsequent cycle. Then, the NOR gate G8 connected with the up/down counter outputs the value 1 so that this counter 18″ counts up. Simultaneously, the toggle flip-flop 49 takes an input at "1" so that it is reversed. With this reveral of the toggle flip-flop 40, the switches SPP and SPN are cross-connected to the lines 31A and 31B, respectively, so that the capacitor array for feeding the negative charge is connected to the (−) input of the charge integrator, whereas the capacitor array for feeding the positive charge is connected with the (+) input of the charge integrator. Since, at this time, the input terminal of the charge integrator is left virtually grounded, no voltage change occurs. As a result, the static time of the charge integrator when the polarity is changed over can be shortened to speed up the operations with ease.

Figure 7:
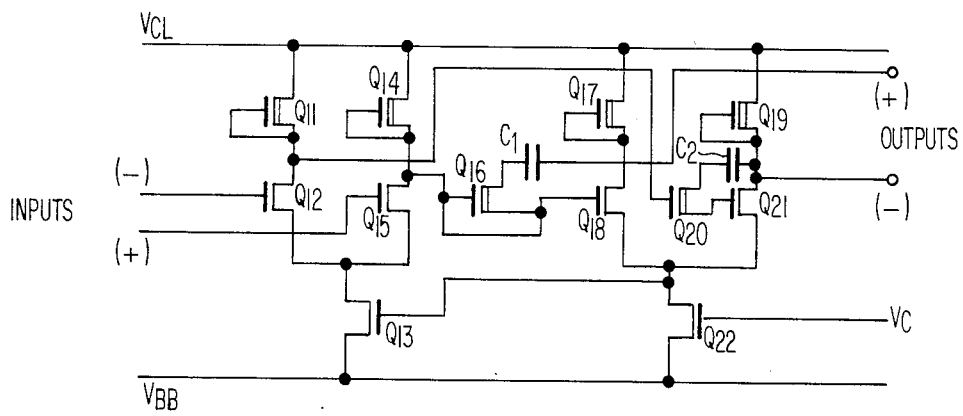
FIG. 7 is a schematic circuit diagram showing an example of a balanced operational amplifier.

FIG. 7 shows an example of the balanced operational amplifier in FIG. 6. The amplifier is composed of enhancement MOS transistors $Q_{12}$, $Q_{13}$, $Q_{15}$, $Q_{18}$, $Q_{21}$ and $Q_{22}$, and depletion MOS transistors $Q_{11}$, $Q_{14}$, $Q_{16}$, $Q_{17}$, $Q_{19}$ and $Q_{20}$. The transistors $Q_{11}$ to $Q_{15}$ form an input stage and the transistors $Q_{17}$ to $Q_{22}$ form an output stage. The transistor $Q_{22}$ receives a bias voltage $V_c$ to serve as a current source. Power supplies $V_{CC}$ and $V_{BB}$ have the same value with respect to the ground potential but have the opposite polarity.

I claim:

1. An analog to digital converter, comprising; a balanced type integrator having a first input terminal, a second input terminal, a first output terminal and a second output terminal; a comparator having first and second input terminals connected to said first and second output terminals of said integrator; first and second sample capacitors having first ends respectively connected to said first and second input terminals of said integrator; means for applying a difference in an analog input signal between second ends of said first and second sample capacitors in a balanced manner; a counter; first control means responsive to the output of said comparator for controlling said counter, a first internal digital to analog converter responsive to the output of said counter for generating a first internal analog signal; first means for subtracting said first internal analog signal from the charge of said first sample capacitor; a second internal digital to analog converter responsive to the output of said counter for generating a second internal analog signal; second means for subtracting said second internal analog signal from the charge of said second sample capacitor; and third means responsive to the output of said comparator for controlling said counter so as to make the output of said comparator equal to zero.

2. The analog to digital circuit according to claim 1, in which said third means includes a toggle flip-flop, an exclusive-NOR gate receiving the output of said comparator and an output of said toggle flip-flop, a NOR gate having inputs connected to respective stages of outputs of said counter, an OR gate receiving an output of said NOR gate and an output of said exclusive-NOR gate for controlling said counter, and gate means for inverting the state of said toggle flip-flop.

3. An analog to digital converter, comprising; a balanced type integrator having a first input terminal, a second input terminal, a first output terminal and a second output terminal; first and second analog signal input terminals; a reference voltage terminal; a ground voltage terminal; first and second capacitor arrays, each of said capacitor arrays including first to n-th (n being a positive integer greater than 2) capacitors having weighted capacitances, the i-th capacitor having a capacitance $2^{i-1} \times C$ (C being constant); first and second feedback capacitors; first and second sample capacitors, a first common line connected to first ends of said first to n-th capacitors of said first capacitor array said first feedback capacitor and said first sample capacitor; a second common line connected to first ends of said first to n-th capacitors of said second capacitor array, said second feedback capacitor and said second sample capacitor; a first switch arrangement including first to n-th switches provided for said first capacitor array, one of said first to n-th switches of said first switch arrangement selectively connecting a second end of one of said first to n-th capacitors of said first capacitor array to one of said reference voltage terminal and said ground voltage terminal; a second switch arrangement including first to n-th switches provided for said second capacitor array, one of said first to n-th switches of said second switch arrangement selectively connecting a second end of one of said first to n-th capacitors of said second capacitor array to one of said reference voltage terminal and said ground voltage terminal; a first feedback switch for selectively connecting a second end of said first feedback capacitor to one of said reference voltage terminal and said ground voltage terminal; a second feedback switch for selectively connecting a second end of said second feedback capacitor to one of said reference voltage terminal and said ground voltage terminal; means for applying an input analog signal between second ends of said first and second sample capacitors in a balanced manner; first switch means for connecting one of said first and second common lines to said first input terminal of said integrator; second switch means for connecting the other of said first and second common lines to said second input terminal of said integrator; a comparator having first and second input terminals; said first and second input terminal of said comparator being connected to said first and second output terminals of said integrator; a counter circuit; first control means for controlling said counter circuit in response to the output of said comparator; second control means responsive to the output of said counter circuit for controlling said first to n-th switches of said first and second switch arrangements; third control means for controlling said first and second feedback capacitors in response to the output of said comparator; and fourth control means responsive to the outputs of said comparator and said counter circuit for controlling said first switch means and said second switch means.

4. The analog to digital converter according to claim 3, in which said fourth control means includes a flip-flop whose state is reversed each time the content of said counter is zero and the polarity of the output of said comparator is changed.

5. The analog to digital converter according to claim 3, in which said first and second feedback capacitors have a capacitance in the range between half the capacitance of said first capacitor and twice the capacitance of said first capacitor.

6. The analog to digital converter according to claim 3, in which said first and second sample capacitors have a capacitance of $2^N \times C$, C being a capacitance of said first capacitor.

* * * * *

UNITED STATES PATENT AND TRADEMARK OFFICE
CERTIFICATE OF CORRECTION

PATENT NO. : 4,764,753

DATED : August 16, 1988

INVENTOR(S) : YUKAWA

It is certified that error appears in the above-identified patent and that said Letters Patent is hereby corrected as shown below:

In the Title, after "CONVERTER" insert --INCLUDING UP/DOWN COUNTER FOR CONTROLLING CAPACITOR ARRAY--

Column 3, line 60, after "Since" delete "an" insert --the--; after "has" delete "the" insert --an--

Column 4, line 2, after "period" delete "," insert --.--

Column 5, line 18, delete "when" insert --When--

Column 6, line 26, after "amplifier" insert a comma (,)

Column 6, line 27, after "the" (first instance) delete ","

Column 6, line 35, after "SF" insert --,--

Column 6, line 57, delete "-$V_R$" insert --+$V_R$--

Column 7, line 11, delete "11D" insert --11B--

Column 8, line 47, delete "12'" insert --12"--

Column 8, line 52, delete "12'" insert --12"--

Column 8, line 54, delete "STA and STB" insert --SFA and SFB--

UNITED STATES PATENT AND TRADEMARK OFFICE
CERTIFICATE OF CORRECTION

PATENT NO.   :   4,764,753

DATED        :   August 16, 1988

INVENTOR(S)  :   YUKAWA

It is certified that error appears in the above-identified patent and that said Letters Patent is hereby corrected as shown below:

Column 9, line 23, delete "49" insert --40--.

Signed and Sealed this

Twenty-first Day of February, 1989

Attest:

DONALD J. QUIGG

*Attesting Officer*    *Commissioner of Patents and Trademarks*